United States Patent [19]

Abe et al.

[11] Patent Number: 5,116,811
[45] Date of Patent: May 26, 1992

[54] CVD METHOD FOR THE FORMATION OF BI-CONTAINING SUPERCONDUCTING THIN FILMS

[75] Inventors: Hitoshi Abe; Tomohiro Nakamori, both of Tokyo, Japan

[73] Assignee: Oki Electric Industry Co., Ltd., Tokyo, Japan

[21] Appl. No.: 474,099

[22] PCT Filed: Sep. 14, 1989

[86] PCT No.: PCT/JP89/00939

§ 371 Date: Jun. 20, 1990

§ 102(e) Date: Jun. 20, 1990

[87] PCT Pub. No.: WO90/03453

PCT Pub. Date: May 4, 1990

[30] Foreign Application Priority Data

Sep. 28, 1988 [JP] Japan .................. 63-242696

[51] Int. Cl.$^5$ .................. B05D 5/12; C23C 16/00
[52] U.S. Cl. .................. 505/1; 505/734; 427/62; 427/255.3; 427/255.2; 427/255.1; 427/126.3; 427/314; 427/419.2; 427/419.1; 427/250
[58] Field of Search .................. 505/1, 734, 782; 427/62, 63, 255.3, 255.2, 255.1, 250, 126.3, 314, 419.2, 419.1

[56] References Cited

PUBLICATIONS

Zhang et al., "Organometallic Chemical Vapor Deposition of High $T_c$ Superconducting Bi-Sr-Ca-Cu-O Films", Appl. Phys. Lett., 54(12), Mar. 1989, pp. 1166-1168.

Yamane et al., "Formation of Bismuth Strontium Calcium Cooper Oxide Superconducting Films by Chemical Vapor Deposition", Jpn. J. Appl. Phys., 27(8), Aug. 1988, L495-L497.

Nasu et al., "Formation of High-$T_c$ Superconducting BiSrCaCuCu$_2$O$_x$ Films on ZrO$_2$/Si(100)", Jpn. J. Appl. Phys., 27(4), Apr. 1988, L634-L635.

Berry et al., "Formation of High $T_c$ Superconducting Films by Organometallic Chemical Vapor Deposition", Applied Physics Letters, vol. 52, No. 20, May 16, 1988, pp. 1743-1745.

Shah, et al., "Growth and Microstructure of Bi-Sr-Ca-Cu-O Thin Films", Applied Physics Letters, vol. 53, No. 5, Aug. 1, 1988, pp. 429-431.

"Growth of Superconducting Thin Films of Bismuth-Strontium-Calcuim-Copper Oxide by Organo Metallic Chemical Vapor Deposition", Berry et al., Journal of Crystal Growth, 92(1988), Oct. 1-2, Amsterdam, the Netherlands.

"Bi-Sr-Ca-Cu-O Thin Films Grown by Metal Organic Chemical Vapor Deposition at Different Temperatures", Natori, Japanese Journal of Applied Physics, 28(1989), Sep. 9, part 2, Tokyo, Japan.

Primary Examiner—Shrive Beck
Assistant Examiner—Roy V. King
Attorney, Agent, or Firm—Edward D. Manzo

[57] ABSTRACT

A method for forming a superconductive thin film according to the invention wherein a superconductive thin film of an oxide obtaining Bi (bismuth) is formed on an substrate by a chemical vapor deposition technique makes use of triphenyl bismuth, Bi-(C$_6$H$_5$)$_3$, as a gas source for bismuth. By this, the resultant superconductive thin film has a flat surface without damages, and good superconductive characteristics. Where the substrate is susceptible to oxidation, at least a mono-atomic layer of bismuth is formed on the substrate, after which the superconductive thin film is formed. Accordingly, stable transmission of a deposition gas is ensured with the substrate being prevented from oxidation.

7 Claims, 3 Drawing Sheets

CVD METHOD FOR THE FORMATION OF BI-CONTAINING SUPERCONDUCTING THIN FILMS

TECHNICAL FIELD

This invention relates to a method for the formation of a superconductive thin film of an oxide containing bismuth.

TECHNICAL BACKGROUND

In recent years, there have been made intensive studies on superconductive materials of oxides which exhibit superconductive phenomena at temperatures higher than those known superconductors composed of materials containing Nb (niobium). This is because if the superconductive phenomena take place at higher temperatures, simpler cooling mechanisms can be used, making it easier to have wide utility of the advantages of such superconductive phenomena in various fields and thus contributing greatly to the development of industries. It has been recently found that Bi-Sr-Ca-Cu-0 superconductors exhibit superconductive phenomena at temperatures of higher than 100 K.

When the oxide superconductors including the Bi-Sr-Ca-Cu-0 oxides are utilized, for example, in the field of microelectronics such as Josephson element, transistors circuit wirings and the like, it is essential that the superconductor be used as a thin film. Many reports have been made on sputtering for use as a technique of forming such a thin film. However, the sputtering technique is disadvantageous in that when film formation is repeated, there is the tendency that the composition of a target is varied and, thus, the compositional ratio in the thin film does not conform to but greatly differs from the compositional ratio of the target.

For instance, where a superconductive oxide thin film is used as the Josephson element, it is necessary to control the film thickness at a molecular layer level. Such a control of the film thickness is very difficult for the sputtering technique. The length of coherence of the oxide superconductor is so short (e.g. approximately 1 nm) that irregularities of a substrate used to form the thin film or irregularities of the thin film surface itself after the film formation adversely influence the length of coherence. Accordingly, the thin film surface after the film formation should preferably be flat from the standpoint of the molecular layer level. The sputtering technique is difficult in obtaining a thin film with a desired level of flatness.

In order to overcome the above disadvantage, Japanese Laid-open Patent Application No. 64-24319, assigned to the present applicant, proposed formation of a superconductive oxide thin film by a chemical vapor deposition technique. According to this method, the following effects are obtained: (1) to form a super conductive thin film having a very smooth surface and good superconductive characteristics; (2) to give less damages on the substrate or on the formed thin film than those as will be caused by physical film formation methods such as the sputtering technique; (3) to obtain a superconductive thin film with arbitrary composition and crystal structure; (4) to enable one to control the growth of thin film corresponding to the length of coherence.

However, in the prior art techniques including that of Japanese Laid-open Patent Application No. 64-24319, any gas source for bismuth is not particularly described when bismuth-containing oxide superconductive thin films are formed by the chemical vapor deposition technique.

The present inventors made intensive studies primarily on metal complexes containing bismuth in order to obtain a material which is suitable for use as a gas source of bismuth. As a result, it was found that trimethyl bismuth, $Bi-(CH_3)_3$, triethyl bismuth, $Bi-(C_2H_5)$, or the like which is so reactive as to violently react with air or oxygen at room temperature is unsuitable for use as a gas source for the chemical vapor deposition process. In addition, triacetylacetone bismuth, $Bi-(CH_3COCH-COCH_3)_3$, or the like is stable at room temperature, but is so low in vapor pressure that when heated, it is decomposed before a satisfactory vapor pressure is obtained, disallowing one to transfer the vapor through a pipe of a chemical vapor deposition apparatus. Thus, this compound is also found unsuitable for use as a gas source for the chemical vapor deposition technique.

It is intended to form a superconductive oxide thin film on a substrate without oxidation wherein if the substrate is made of a material susceptible to oxidation, e.g. a semiconductive substrate such as silicon, GaAs or the like, or a metal electrode, whose electric resistance increases by the oxidation, and a super conductive oxide thin film is further formed on the semiconductive substrate or the metal electrode as a lead wiring, the substrate will be oxidized in an oxygen atmosphere for the film formation by the sputtering or chemical vapor deposition technique, or with a substance containing oxygen used as a gas source used in the chemical vapor deposition technique. Accordingly, there is the demand for a technique which can prevent the oxidation.

Therefore, a first object of the invention is to provide a method for forming a bismuth-containing oxide superconductive thin film by chemical vapor deposition. A second object of the invention is to provide a method for conveniently forming a bismuth-containing oxide superconductive thin film on a substrate susceptible to oxidation by chemical vapor deposition.

DISCLOSURE OF THE INVENTION

The formation method of a superconductive thin film according to the invention wherein a superconductive thin film of an oxide containing Bi (bismuth) is formed on a substrate by chemical vapor deposition, is characterized in that triphenyl bismuth, $Bi-(C_6H_5)_3$, is used as a gas source for bismuth.

When the superconductive thin film is formed on an substrate which is susceptible to oxidation, at least one atomic layer of bismuth is initially formed on substrate, after which the supercoductive thin film of the oxide is formed.

Triphenyl bismuth used in the practice of the invention as the gas source of bismuth exhibits a vapor pressure sufficient to form a bismuth-containing oxide superconductive thin film by chemical vapor deposition at a temperature of approximately 150° C., and does not decompose at temperatures of not higher than 300° C. This allows pipings to be heated at temperatures of about 300° C. without any troubles, ensuring stable transmission of the growth gas.

When the substrate is made of a material susceptible to oxidation, at least a mono-atomic layer of bismuth is initially formed on the substrate in an atmosphere substantially free of oxygen. Since triphenyl bismuth used as the gas source for bismuth is a compound which is free of oxygen, the bismuth layer which is substantially free of oxygen can be formed on the substrate. Upon subsequent formation of a superconductive thin film of the oxide, the bismuth layer serves as a protective layer for oxidation of the substrate, thus preventing the substrate from being oxidized.

BEST MODE FOR CARRYING OUT THE INVENTION

The embodiments of the invention are directed to a method for forming a superconductive thin film which is characterized in that triphenyl bismuth, Bi-$(C_6H_5)_3$, is used as a gas source of bismuth. The formation method is described in the following order with respect to (a) an apparatus used to form the thin film in the embodiments and (b) embodiments of forming thin films and characteristics of the thin films.

(a) Description of The Apparatus

Figure 1:
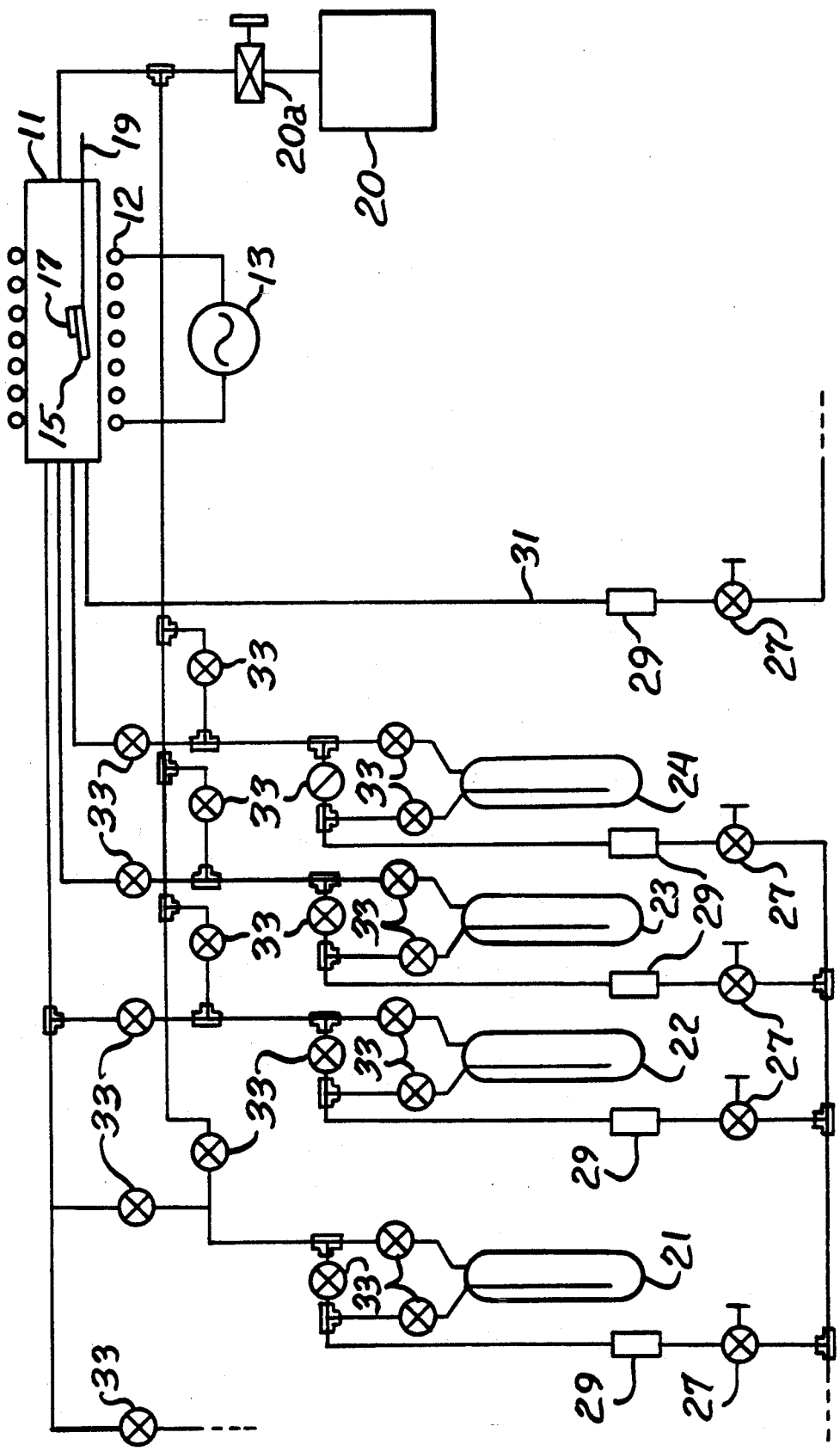
FIG. 1 is a schematic illustrative view of a chemical vapor deposition apparatus for carrying out methods for forming a superconductive oxide thin film according to first and second embodiments of the invention.

FIG. 1 shows a block diagram schematically showing an arrangement of a chemical vapor deposition apparatus used to form a thin film in embodiments of the invention.

In FIG. 1, reference numeral 11 indicates a deposition vessel (which may be called reactor tube), which is constituted, for example, of quartz. The deposition vessel 11 is wound with an induction coil 12 made, for example, of a copper pipe therearound. The induction coil 12 is connected to a high frequency power source 13. Reference numeral 15 designates a susceptor made of a metal alloy such as, for example, Hustelloy (commercial name, with a composition of Ni, Cr, Fe and the like). A substrate can be mounted on the susceptor 15. In the figure, a substrate on the susceptor is indicated at 17. Although the material for the substrate 17 may depend on the type of superconductive oxide thin film to be formed thereon, substrates may comprise MgO, $SrTiO_3$, $M_xWO_3$ (wherein Mx represents Li, Na, K or the like), zirconia, sapphire, semiconductive substrates such as silicon, GaAs and the like, or superconductive materials. At the time of the formation of a superconductive oxide thin film, the substrate 17 is heated to a desired temperature by high frequency induction heating by the use of the induction coil 12 and the high frequency power source 13. Reference numeral 19 indicates a thermocouple and this thermocouple 19 is brought into contact with the substrate 17. By this, the temperature of the substrate 17 is monitored and the high frequency induction heating can be so controlled that the substrate temperature reaches a desired level.

Indicated at 20 is an evacuating device, which may be constituted of any known device arrangement, by which the deposition vessel can be at a given level of vacuum. The evacuating device 20 has an adjuster 20a for adjusting a conductance in the evacuation passage, thereby arbitrarily changing the conductance.

Indicated at 21 is a first bomb, at 22 is a second bomb, at 23 is a third bomb and at 24 is a fourth bomb. These bombs 21, 22, 23 and 24 are arranged to heat the insides thereof to desired temperatures, respectively, and connected through pipes to the deposition vessel 11. In this embodiment, the bombs 21, 22, 23 and 24 are so arranged that a carrier gas can be fed through needle valves 27 and flow meters 29, respectively. The deposition vessel is connected with a pipe 31 for supplying oxygen gas which has a needle valve 27 and a flow meter 29 as shown. Accordingly, a given amount of oxygen gas can be supplied to the deposition vessel 11.

In the apparatus of this arrangement, for suitable starting materials used to form a superconductive oxide thin film, there are stored a Sr (strontium) compound such as $Sr(DPM)_2$ in the first bomb 21, a Ca (calcium) compound such as $Ca(DPM)_2$ in the second bomb 22, a Cu (copper) compound such as $Cu(DPM)2$ in the third bomb 23, and triphenyl bismuth used as a Bi compound in the fourth bomb 24. The abbreviation "DPM" means 2,2,6,6-tetramethyl-3,5-heptaneodianate of the following chemical formula, $^-CH_3C(CH_3)_2COCH\text{-}COC(CH_3)_2CH_3$. The respective compounds stored in the first to fourth bombs are all solid at normal temperatures and are gasified when heated. In order that the respective compounds are gasified at appropriate vapor pressures, the insides of the first bomb 21, second bomb 22, third bomb 23 and fourth bomb 24 should be, respectively, heated at temperatures of 220–280° C., 190–260° C., 120–200° C. and 100–180C. Moreover, an inert gas such as He, Ne, Ar, Kr, Xe or $N_2$ is supplied as a carrier gas for the respective bombs 21, 22, 23 and 24. Bubbling of the carrier gas in the respective bombs will lead to transmission of starting gases containing corresponding elements (Sr, Ca, Cu or Bi) into the deposition vessel 11.

It will be noted that the flow rates of the respective starting gases should be controlled at give levels by the use of the needle valves 27 and the flow meters 29 of the bombs. The control of the supply times of the respective starting gases can lead to the control of the compositional ratios of a superconductive oxide thin film. The oxygen gas may be invariably supplied to the deposition vessel 11 at a constant rate, or may be supplied simultaneously with the supply of the respective gases. The change of the content of oxygen in the thin film may be made by the control of the flow rate and supplying time of oxygen, or by regulating the adjuster 20a of the evacuating device.

When valves indicated at 23 in FIG. 1 are operated in different ways of combination, the order of supplying the respective starting gases to the deposition vessel can be arbitrarily selected, so that a thin film with desired composition and structure can be deposited.

(b) Embodiments For The Formation of thin Films and Description of Thin Film Characteristics The chemical vapor deposition apparatus shown in FIG. 1 was used to form superconductive thin films of Bi-Sr-Ca-Cu-0. The formation procedure and the superconductive characteristics of the resultant thin films are described.

First Embodiment $Sr(DPM)_2$, $Ca(DPM)_2$, $Cu(DPM)_2$, and Bi-$(C_6H_5)_3$ were, respectively, charged into the first, second, third and fourth bombs 21, 22, 23 and 24 for use as starting source gases. The temperature in the first bomb 21 was set at about 260° C., the temperature in the second bomb 22 was set at about 235° C., the temperature in the third bomb 23 was set at about 170° C., and the temperature in the fourth bomb 24 set was at about 140° C., by which the respective starting gas sources were gasified. At the same time, the carrier gas (Ar in this example) fed to each of the bombs 21, 22, 23 and 24 was set at a flow rate of 200 cc/min and the flow rate of oxygen was set at 200 cc/min.

The substrate 17 used was made of MgO and made use of plane (100) on which a superconductive thin film was to be formed. While the temperature of the substrate 17 or the deposition temperature for superconductive thin film was maintained at about 600° C., the starting gases and oxygen gas were supplied from the respective bombs 21, 22, 23 and 24 into the deposition vessel 11, followed by deposition of a thin film on the substrate 17 for about 30 minutes. After the deposition, the substrate temperature was raised to 850° C. and oxygen was continued to be supplied into the deposition vessel 11 under which the thermal treatment was effected for several tens of minutes. Thereafter, while oxygen was continued to be supplied to the deposition vessel 11, the substrate temperature was gradually decreased down to room temperature, after which the substrate 17 was removed from the deposition vessel 11. By the above procedure, a Bi-Sr-Ca-Cu-O-based superconductive thin film 18 was formed. The observation in section of the deposited thin film 18 through scanning electron microscope (SEM) revealed that the deposited film thickness was about 5 micrometer.

Figure 2:
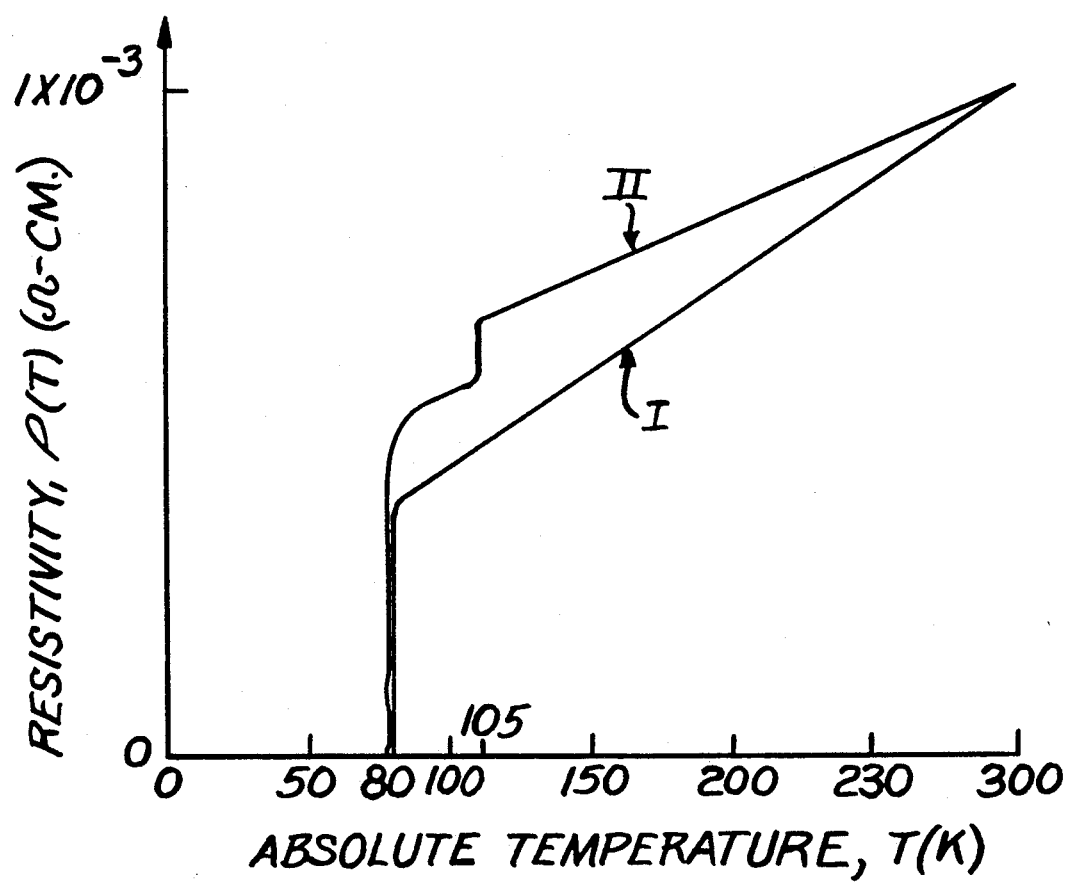
FIG. 2 is a graph showing a resistance-temperature characteristic of each of the superconductive thin films formed by the methods according to the first and second embodiments of the invention.

The superconductive thin film formed according to the procedure of the first embodiment was subjected to measurement of a resistance-temperature characteristic by an ordinary fourterminal method. The results are plotted as shown in I of FIG. 2 wherein the ordinate indicates a resistivity (T) and the abscissa indicates an absolute temperature T(K). It was found that in the first embodiment, the resistance of the thin film decreased with a lowering of the temperature and became completely zero in the vicinity of an absolute temperature of 80 K.

Since the thin film deposition is effected by the chemical vapor deposition technique, satisfactory results are obtained including (1) good surface smoothness, (2) reduced damages of the thin film and (3) easy control of the film thickness.

Second Embodiment

The second embodiment is now described. In the second embodiment, triphenyl bismuth, Bi-$(C_6H_5)_3$, was used as the gas source of bismuth in the same manner as in the first embodiment. The differences for the first embodiment was that the deposition temperature (substrate temperature) for superconductive thin film was set at 700-750° C. and that any thermal treatment was not effected after the film formation. The substrate used, the supplying conditions of the respective gases into the deposition vessel, the deposition time for the thin film and the gradual cooling conditions of the substrate were similar to those used in the first embodiment.

The resistance-temperature characteristic of the superconductive thin film formed according to the procedure of the second embodiment was measured in the same manner as in the first embodiment. The results were plotted with the characteristic being shown as II in FIG. 2. It was found that the resistance of the thin film obtained according to the procedure of the second embodiment decreased with a decrease of the temperature and the changing rate of the resistance increased at an absolute temperature of 105-110K, and the film reached completely zero degrees in the vicinity of 80K. Accordingly, in the absence of the high temperature thermal treatment after the deposition of the thin film, such a characteristic that the resistance was completely zero in the vicinity of an absolute temperature of 80 K is obtained.

Third Embodiment

The third embodiment is now described. In the third embodiment, triphenyl bismuth, Bi-$(C_6H_5)_3$, was used as the gas source of bismuth in the same manner as in Embodiments 1 and 2. The differences from the first and second embodiments are that for the formation of thin film, at least a mono-atomic layer of bismuth was initially formed on the substrate on which a superconductive thin film of the oxide was subsequently formed. An example wherein a superconductive base transistor is formed is described as Application.

Figure 3:
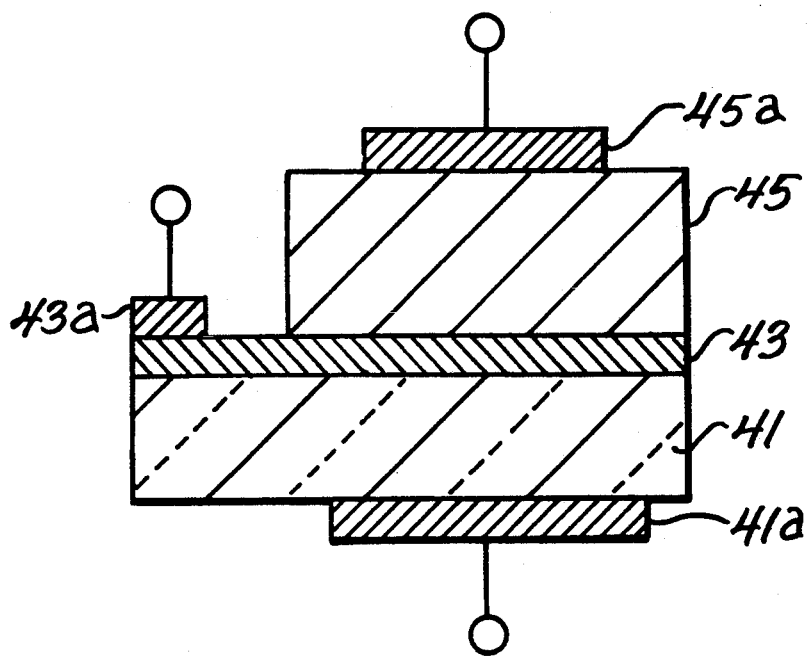
FIG. 3 is a schematic sectional view of a superconductive base transistor used to illustrate a third embodiment of the invention.
Figure 4:
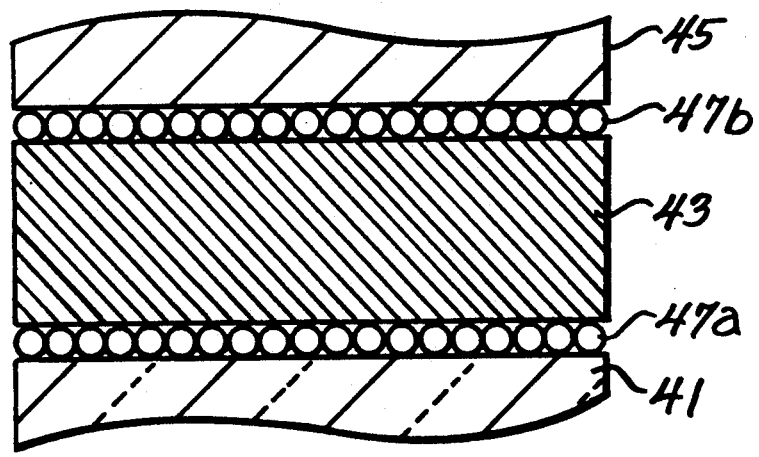
FIG. 4 is a schematic sectional view of an essential part of the superconductive base transistor for illustrating the third embodiment of the invention.

FIG. 3 is a sectional view schematically showing the structure of a supercoductive base transistor. The fundamental structure of the transistor is a three-layer structure including a collector region 41, a superconductive base region 43 and an emitter region 45 wherein the base region composed of the superconductive oxide thin film is formed between the collector region 41 and the emitter region 45 by the Schottky contact. The collector region 41 has a collector electrode 41a and the emitter region 45 has an emitter electrode 45a, each by ohmic contact. A base electrode 43a is formed on the superconductive base region 43 In such an arrangement, when the superconductive film is formed, for example, on the collector region 41 by the chemical vapor deposition technique in a state where oxygen is supplied or a starting gas used is one which contains an oxygen atom, the semiconductor surface (collector region surface) is oxidized. The resultant oxide film forms an interface state, causing the transistor to deteriorate in characteristics. This presents the problem that the merit of the superconductive thin film cannot be conveniently used. To avoid this problem, the following procedure is taken according to the third embodiment. FIG. 4 is a view illustrating this procedure and is particularly a sectional view of an essential part of the superconductive base.

Initially, the semiconductive substrate having the collector region 41 was mounted on the susceptor 15 in the deposition vessel 11 shown in FIG. 1. Subsequently, the deposition vessel 11 was evacuated by means of the device 20 to a predetermined level. While the valves for the pipes through which oxygen was supplied were closed, the starting gas containing bismuth was supplied into the deposition vessel 11 from the fourth bomb 24 where the triphenyl bismuth was charged. In this embodiment, the gas feed conditions and valving conditions were so controlled that mono-atomic layer of bismuth was absorbed on the collector region 41. Reference numeral 47a shown in FIG. 4 indicates the mono-atomic layer of bismuth absorbed on the collector 41. Thereafter, the deposition vessel was evacuated by means of the evacuating device 20, after which gas sources of Sr$(DPM)_2$, Ca$(DPM)_2$, Cu$(DPM)_2$, and Bi-$(C6H5)_3$ were used in the same manner as in the first and second embodiments to form a Bi-Sr-Ca-Cu-0 oxide superconductive thin film (superconductive base region 43) on the bismuth mono-atomic layer 47a by the chemical vapor deposition technique. The formation of the superconductive thin film were effected under the same deposition conditions as described in the first and second embodiments.

In the third embodiment wherein the superconductive base transistor is formed, a semiconductive layer serving as the emitter region has to be formed on the superconductive oxide thin film. When the semiconductive layer for emitter is directly deposited on the superconductive oxide thin film, there is the danger that the interface of the semiconductive emitter layer in contact with the superconductive oxide thin film is oxidized by the attack of the oxygen atom contained in the superconductive thin film. To avoid this, in this embodiment, at least a monoatomic layer of bismuth was formed on the superconductive oxide thin film according to the procedure used to form the mono-atomic layer of bismuth on the semiconductive collector layer. A layer 47b in FIG. 4 is a mono-atomic layer of bismuth formed on the superconductive oxide thin film (superconductive base region 43). Thereafter, the semiconductive emitter layer 45 was epitaxially deposited on the monoatomic bismuth layer 47b by an appropriate technique to complete a fundamental element portion of the superconductive base transistor.

The superconductive base transistor formed according to the procedure of the third embodiment is prevented from oxidation and damage of the semiconductors at the interfaces in the semiconductor/superconductor/semiconductor layered structure, thus showing good electric characteristics.

The bismuth layer initially formed in the third embodiment need not always be a single mono-atomic layer but may be designed to have a greater thickness.

The third embodiment has been described as an example of forming the superconductive base transistor. When the substrate is a metal electrode (e.g. Al) which is susceptible to oxidation and whose electric resistance increases when it is oxidized and a superconductive oxide thin film is formed on the metal electrode as a lead wiring, provision of the bismuth layer between the metal electrode and the superconductive thin film can prevent the electric resistance at the metal electrode portion from increasing, thus being effective in saving energy at the superconductive thin film portion.

Industrial Utility

As will be apparent from the foregoing, the method for forming a supercoductive oxide thin film according to the invention makes use of a chemical vapor deposition technique using an appropriate gas source of bismuth, so that the resultant superconductive thin film of an oxide containing bismuth is smooth on the surface thereof with a reduced degree of damage and has good superconductive characteristics. The composition and film thickness can be readily controlled. Accordingly, the superconductive thin film of the bismuth-containing oxide had wide utility in various fields.

Moreover, according to the invention, the superconductive thin film can be formed on a substrate, which is susceptible to oxidation, without undergoing oxidation of the substrate. The application range of the superconductive bismuth-containing oxide thin film can be further widened.

What is claimed is:

1. A method for forming a superconductive thin film on a heated substrate with a metal layer, comprising the steps of:
   forming said metal layer consisting of at least a monoatomic layer of bismuth on said substrate; and
   forming said superconductive thin film of an oxide containing bismuth on said metal layer by a chemical vapor deposition technique using triphenyl bismuth $Bi(C_6H_5)_3$ as a gas source for bismuth.

2. a method for forming a superconductive thin film according to claim 1, wherein said superconductive thin film is a Bi-Sr-Ca-Cu-O thin film formed on said substrate by a chemical vapor deposition technique using starting gases and an oxygen gas, and said starting gases are $Bi(C_6H_5)_3$, $Sr(DPM)_2$, $Ca(DPM)_2$ and $Cu(DPM)_2$.

3. A method for forming a supercoductive thin film according to claim 2, wherein the deposition temperature is equal to or less than 750° C.

4. A method for forming a superconductive thin film according to claim 1, wherein said at least a monoatomic layer of bismuth is formed on the substrate by a chemical vapor deposition technique using $Bi\text{-}(C_6H_5)_3$ as a gas source for bismuth.

5. A method for forming a superconductive thin film using a chemical vapor deposition technique on a substrate with a metal layer, comprising the steps of:
   disposing said substrate in a deposition vessel;
   forming said metal layer consisting of at least a monoatomic layer of bismuth on said substrate;
   preheating said substrate;
   introducing into said deposition vessel starting source gases of $Bi\text{-}(C_6H_5)_3$, $Sr(DPM)_2$, $Ca(DPM)_2$ and $Cu(DPM)_2$, wherein DPM is 2,2,6,6-tetramethyl-3,5-heptanedianate; and
   simultaneously introducing into said deposition vessel a source gas of oxygen whereby said superconductive thin film is formed on said metal layer.

6. A method for forming a superconductive thin film according to claim 5, wherein said metal layer is formed by a chemical vapor deposition technique using $Bi\text{-}(C_6H_5)_3$ as a gas source for bismuth.

7. A method for forming a superconductive thin film according to claim 5, wherein said step of preheating said substrate is effected at the time of forming said metal layer.

* * * * *